US012682142B1

(12) United States Patent
Asher et al.

(10) Patent No.: US 12,682,142 B1
(45) Date of Patent: Jul. 14, 2026

(54) SYSTEM AND METHOD FOR COHERENCY PROTOCOL VERIFICATION

(71) Applicant: Marvell Asia Pte Ltd, Singapore (SG)

(72) Inventors: David H. Asher, Sutton, MA (US); Catherine Choi, Hopkinton, MA (US)

(73) Assignee: Marvell Asia Pte Ltd, Singapore (SG)

( * ) Notice: Subject to any disclaimer, the term of this patent is extended or adjusted under 35 U.S.C. 154(b) by 887 days.

(21) Appl. No.: 18/049,584

(22) Filed: Oct. 25, 2022

(51) Int. Cl.
*G06F 30/327* (2020.01)
*G06F 30/20* (2020.01)

(52) U.S. Cl.
CPC ............ *G06F 30/327* (2020.01); *G06F 30/20* (2020.01)

(58) Field of Classification Search
CPC ................................ G06F 30/327; G06F 30/20
See application file for complete search history.

(56) References Cited

U.S. PATENT DOCUMENTS

| | | | |
|---|---|---|---|
| 8,468,510 B1 * | 6/2013 | Sundararajan | ........ G06F 30/343 717/152 |
| 8,793,628 B1 * | 7/2014 | Varma | .................. G06F 30/331 703/23 |
| 8,943,449 B1 * | 1/2015 | Varma | .................. G06F 30/331 716/108 |
| 9,058,463 B1 | 6/2015 | Ikram et al. | |
| 9,355,206 B2 | 5/2016 | Ikram et al. | |
| 10,002,218 B2 | 6/2018 | Ikram et al. | |
| 10,643,012 B1 * | 5/2020 | McIlwain | ............. G06F 30/327 |

| | | | |
|---|---|---|---|
| 2015/0095008 A1 * | 4/2015 | Wang | .................. G06F 12/0815 703/20 |
| 2015/0154341 A1 * | 6/2015 | Ikram | ..................... G06F 30/30 716/111 |
| 2015/0213173 A1 * | 7/2015 | Meyer | ................. G06F 30/3308 703/14 |
| 2016/0267209 A1 * | 9/2016 | Ikram | ..................... G06F 30/30 |
| 2024/0086602 A1 * | 3/2024 | Jain | ..................... G06F 30/3312 |

OTHER PUBLICATIONS

"Memory coherence," Wikipedia Retrieved from the Internet at https://en.wikipedia.org/wiki/Memory_coherence on Aug. 15, 2022.
(Continued)

*Primary Examiner* — Nha T Nguyen
(74) *Attorney, Agent, or Firm* — Hamilton, Brook, Smith & Reynolds, P.C.

(57) ABSTRACT

A system and corresponding method perform verification. The system comprises a verification checker that monitors protocol messages of a coherency protocol. The coherency protocol is implemented via register-transfer level (RTL) logic of a chip to maintain cache coherency on the chip. The protocol messages are generated via the RTL logic. The system further comprises at least one memory. The verification checker performs verification of the coherency protocol based on system state stored in the at least one memory. The verification performed includes updating the system state based on the protocol messages monitored and controlling timing for the updating based on message classes. The message classes are associated with the protocol messages monitored. The verification checker reduces the likelihood that a processor design will have data inconsistency issues and can reduce time-to-market as verification implemented via the verification checker can make the verification effort more efficient.

26 Claims, 13 Drawing Sheets

(56) References Cited

OTHER PUBLICATIONS

Mattu, "Verifying ARM AMBA 5 CHI Interconnect-Based SoCs Using Next-Generation VIP;" SYNOPSYS, Downloaded from the Internet on Oct. 18, 2022 at https://www.synopsys.com/designware-ip/technical-bulletin/verifying-arm-amba.html.

ARM, "AMBA 5 CHI Architecture Specification," Aug. 4, 2017.

Cheeve, "Quick Quartus: Verilog," Retrieved from the Internet at https://cheever.domains.swarthmore.edu/Ref/embedRes/QQS_V/QuickQuartusVerilog.html on Oct. 24, 2022.

* cited by examiner

SYSTEM AND METHOD FOR COHERENCY PROTOCOL VERIFICATION

BACKGROUND

In digital circuit design, register-transfer level (RTL) is a design abstraction which models a digital circuit in terms of the flow of digital signals (data) between hardware registers, and the logical operations performed on those signals. RTL abstraction is used in hardware description languages (HDLs), such as such as the Verilog® hardware description language (HDL) or very high speed integrated circuit VHSIC HDL (VHDL™), to create high-level representations of a circuit from which lower-level representations and, ultimately, actual wiring can be derived. Design at the RTL level is typical practice in digital design.

RTL design verification is typically the most time-consuming phase in a chip design process and is a level of abstraction at which verification may be performed by a verification engineer. The purpose of verification is to identify and correct design defects in the chip before it goes into manufacturing.

SUMMARY

According to an example embodiment, a system comprises a verification checker configured to monitor protocol messages of a coherency (coherence) protocol implemented via register-transfer level (RTL) logic of a chip to maintain cache coherency on the chip. Such RTL logic may be referred to herein simply as RTL. The protocol messages are generated via the RTL logic. The system further comprises at least one memory. The verification checker is further configured to perform verification of the coherency protocol based on system state stored in the at least one memory. The verification performed includes updating the system state based on the protocol messages monitored and controlling timing for the updating based on message classes. The message classes are associated with the protocol messages monitored.

The system may further comprise a simulator configured to perform simulation of the RTL logic and the protocol messages may be generated via the simulation performed.

The message classes may include a fast-path message class. The timing for the updating may be immediate in an event the fast-path message class is associated with a protocol message of the protocol messages monitored.

The fast-path message class may indicate that the protocol message associated therewith results in access to memory being granted.

The message classes may include a slow-path message class and the timing for the updating may be delayed and responsive to a trigger in an event the slow-path message class is associated with a protocol message of the protocol messages monitored.

The trigger may be a response protocol message of the coherency protocol. The slow-path message class may indicate that the protocol message associated therewith results in access to memory being removed.

The verification checker may be further configured to determine, responsive to the updating, whether the system state updated is a legal state or an illegal state. The verification checker may be further configured to generate an output in an event the system state updated is determined to be the illegal state.

The output may be an error message for non-limiting example. The verification checker may be further configured to output the error message to a simulation log file for non-limiting example. The error message may include a representation of a cache line address associated with the illegal state, a reason for the illegal state, or a combination thereof for non-limiting examples.

The illegal state may be determined based on an ownership state for a cache line indicating multiple exclusive owners for non-limiting example.

The verification checker may be further configured to update the system state and control the timing for the updating on a protocol-message-by-protocol-message basis. The verification checker may be further configured to identify, on the protocol-message-by-protocol-message basis, a respective message class associated with a protocol message of the protocol messages monitored.

The verification checker may be further configured to identify the message classes associated with the protocol messages monitored by employing a protocol-message-to-message-class map. The protocol-message-to-message-class map may include mappings between opcodes of the protocol messages monitored and identifiers of the message classes.

The chip may include a plurality of processor cores. The system state may include per-cache-line-per-processor-core ownership state for each processor core of the plurality of processor cores.

According to another example embodiment, a method comprises monitoring protocol messages of a coherency protocol implemented via register-transfer level (RTL) logic of a chip to maintain cache coherency on the chip. The protocol messages are generated via the RTL logic. The method further comprises performing verification of the coherency protocol based on system state. The verification performed includes updating the system state based on the protocol messages monitored and controlling timing for the updating based on message classes. The message classes are associated with the protocol messages monitored.

Alternative method embodiments parallel those described above in connection with the example system embodiment.

According to another example embodiment, a non-transitory computer-readable medium has encoded thereon a sequence of instructions which, when loaded and executed by at least one processor, causes the at least one processor to monitor protocol messages of a coherency protocol implemented via register-transfer level (RTL) logic of a chip to maintain cache coherency on the chip. The protocol messages are generated via the RTL logic. The sequence of instructions further causes the at least one processor to perform verification of the coherency protocol based on system state. The verification performed includes updating the system state based on the protocol messages monitored and controlling timing for the updating based on message classes. The message classes are associated with the protocol messages monitored.

Alternative non-transitory computer-readable medium embodiments parallel those described above in connection with the example system embodiment.

According to yet another example embodiment, an apparatus comprises means for monitoring protocol messages of a coherency protocol implemented via register-transfer level (RTL) logic of a chip to maintain cache coherency on the chip. The protocol messages are generated via the RTL logic. The apparatus further comprises means for performing verification of the coherency protocol based on system state. The verification performed includes updating the system state based on the protocol messages monitored and controlling timing for the updating based on message classes. The message classes are associated with the protocol messages monitored.

Alternative apparatus embodiments parallel those described above in connection with the example system embodiment.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1:
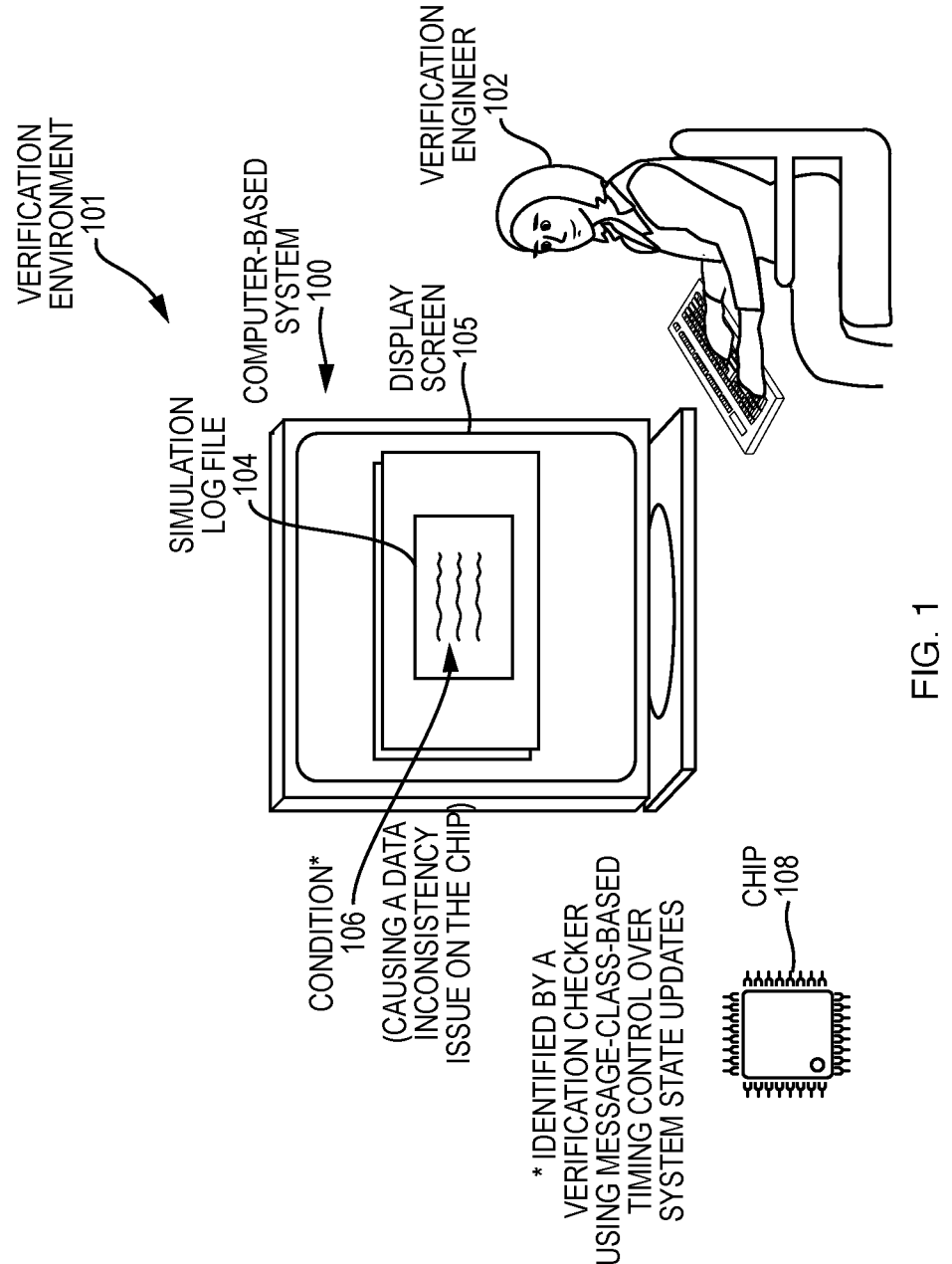
FIG. 1 is a block diagram of an example embodiment of a verification environment.

A description of example embodiments follows.

While example embodiments disclosed herein may be described with reference to the ARM® Advanced Microcontroller Bus Architecture (AMBAR) Coherent Hub Interface (CHI) protocol read/write instructions and their associated response/acknowledge/data, it should be understood that such embodiments are not limited to being CHI-based and such read/write instructions, and their associated response/acknowledge/data, may vary depending on an interconnect employed in a multicore processor-based system. It should also be understood that the terms "unique" and "exclusive" may be used interchangeably herein with regard to cache line ownership. While the CHI protocol may employ the term unique, other protocols, such as the Modified, Exclusive, Shared, Invalid (MESI) or Modified, Owned, Exclusive, Shared, Invalid (MOESI) coherency protocols, may employ the term exclusive. The terms unique and exclusive may be used interchangeably herein to indicate that a cache line is present in the local cache of a respective node and is writable and coherent with main memory.

To meet the low-power, performance and functionality demands of advanced electronics products, a typical system-on-a-chip (SoC) is designed to be a multicore SoC or a multi-chip or multi-core design may be employed for data consistency. In this environment, on-chip cache memory plays an important role, as memory architecture is fundamental in determining system performance. In a multicore SoC, individual cores employ on-chip cache memory and access and share data across the entire chip. Cache memories fetch and store data in local caches to facilitate data sharing. Cache coherency ensures getting the right data to the right place at the right time.

While cache control protocols were once implemented as flexible software implementations, the performance requirements of multi-block multi-threaded integrated circuits (ICs) have moved such protocols into on-chip hardware implementations. To address the issue of maintaining cache coherency in multicore chips, ARM created the ARM AMBA ACE™ (AXI Coherency Extensions) and a number of interconnect implementations that use AXI4™ and ACE to deploy hardware-based cache coherency. Building on the ACE specification, the AMBA CHI was released, which is a packet-based protocol developed to provide high-performance, cache-coherent communication between processors.

When designing a memory sub-system, it is useful to maintain coherence of multiprocessor accesses. A coherency protocol, such as CHI for non-limiting example, which is employed for such coherence should be subject to extensive verification. One of the most difficult portions of this verification involves detecting when a race between one or more messages in the protocol can cause transient coherence issues or data consistency issues. A coherency issue results in data being lost. With a data consistency issue, however, data is not lost. Stale data is, however, observed by a programming model when it shouldn't be. Data inconsistency is notoriously difficult to identify due to its dependency on access patterns and timing messages through an interconnect that may couple multiple systems, such as multiple processor cores with respective memory sub-systems that include a cache(s).

Data inconsistency issues occur when an agent, such as a processor core for non-limiting example, attempts to acquire new or upgraded exclusive access to a cache line. A cache line is a block of memory that is transferred to a memory cache and may be static or dynamic in size, typically ranging from 16 to 256 bytes for non-limiting example. Data inconsistency occurs when new data written by an agent to a location becomes visible before other agents have been notified that the present data at the location has been invalidated.

To prevent data inconsistency, messages in the protocol which provide new or upgraded access to the location should be observed only after messages that remove access from the other agents are observed. For example, a cache line may transition from A to B responsive to being changed by a processor core. Other processor cores that view A should be notified via a protocol message that the data, namely A, is old (stale), prior to the new data, namely B, becoming visible to the system. Coherence protocol verification may be performed to identify instances in which B may be viewed prior to system-wide invalidation of A such that a design issue causing such a protocol violation can be addressed, prior to manufacturing (tape-out) of the chip.

Conventional techniques for coherence protocol verification typically include performing 1) random exerciser runs, with random delays and often employ back pressure mechanisms in an attempt to expose conditions in which data inconsistency may occur. Alternatively, a common technique is to perform 2) formal verification of the protocol or 3) review of the protocol among experts in chip design/verification. Unfortunately, all these methods, namely 1)-3), have drawbacks. Random exerciser runs rely on large numbers of runs on register-transfer level (RTL) simulations which, as designs get larger, can become unwieldy. Typically, attempts are made to reduce the size of the verification simulations. Such reductions can themselves hide race conditions causing data inconsistency because they may reduce the system topology to a topology that is less prone to such race conditions. While formal verification may detect data inconsistencies, such detection typically occurs late in the design cycle and requires a large amount of runtime. In addition, verification reviews, though useful, are also prone to error as the complexities of the system increase.

An example embodiment disclosed herein may apply static timing race analysis techniques to early detection of coherence protocol races. A coherence protocol's messages may be divided into two classes, namely: 1) messages on a "fast path" and 2) messages on a "slow path." Such messages may be referred to as fast-path messages and slow-path messages, respectively. An example embodiment of a verification environment disclosed herein may be employed to detect data inconsistency race conditions, also referred to herein simply as races, without having to rely on random delays and complex back pressure scenarios employed in typical RTL simulations.

According to an example embodiment, fast-path messages may be messages in the coherency protocol which can result in an agent in the system being given access to a piece of memory, while the slow-path messages may be those protocol messages that remove access to a piece of memory from the other agents in the system. By carefully selecting which messages are in which class, namely a fast-path message class and slow-path message class, and by checking for multiple agents having conflicting access to the same piece of memory at each stage of the coherency protocol, the data consistency errors can be found-independent of the delays in a system interconnect of the SoC.

An example embodiment disclosed herein may reduce the time to find issues in coherency protocols and reduce a required size and complexity of a simulation test bench(es) employed to exhibit conditions that cause data inconsistency issues. As a result, a likelihood of a processor design having data inconsistency issues may be reduced, and time-to-market for a chip based on such design may also be reduced, as the verification effort effectuated via an example embodiment disclosed herein is more efficient relative to conventional verification employed by a verification engineer, such as the verification engineer of FIG. 1, disclosed below.

FIG. 1 is a block diagram of an example embodiment of a verification environment 101 in which a verification engineer 102 is viewing a simulation log file 104 on a display screen 105 of a computer-based system 100. In the example embodiment, the simulation log file 104 includes a representation, such as text for non-limiting example, that identifies a condition 106 that would otherwise cause a data inconsistency issue on a chip 108. Such condition 106 is, however, identified by a verification checker, such as the verification checker 110 of FIG. 2, disclosed further below. By identifying the condition 106 in the verification environment 101, a register-transfer level (RTL) design of the chip 108 can be modified to fix a design issue causing such condition, prior to tape-out of the chip 108 and its deployment into the field for use by a consumer. The condition 106 may be identified by the verification checker via message-class-based timing control over system state updates, as disclosed below with regard to FIG. 2.

Figure 2:
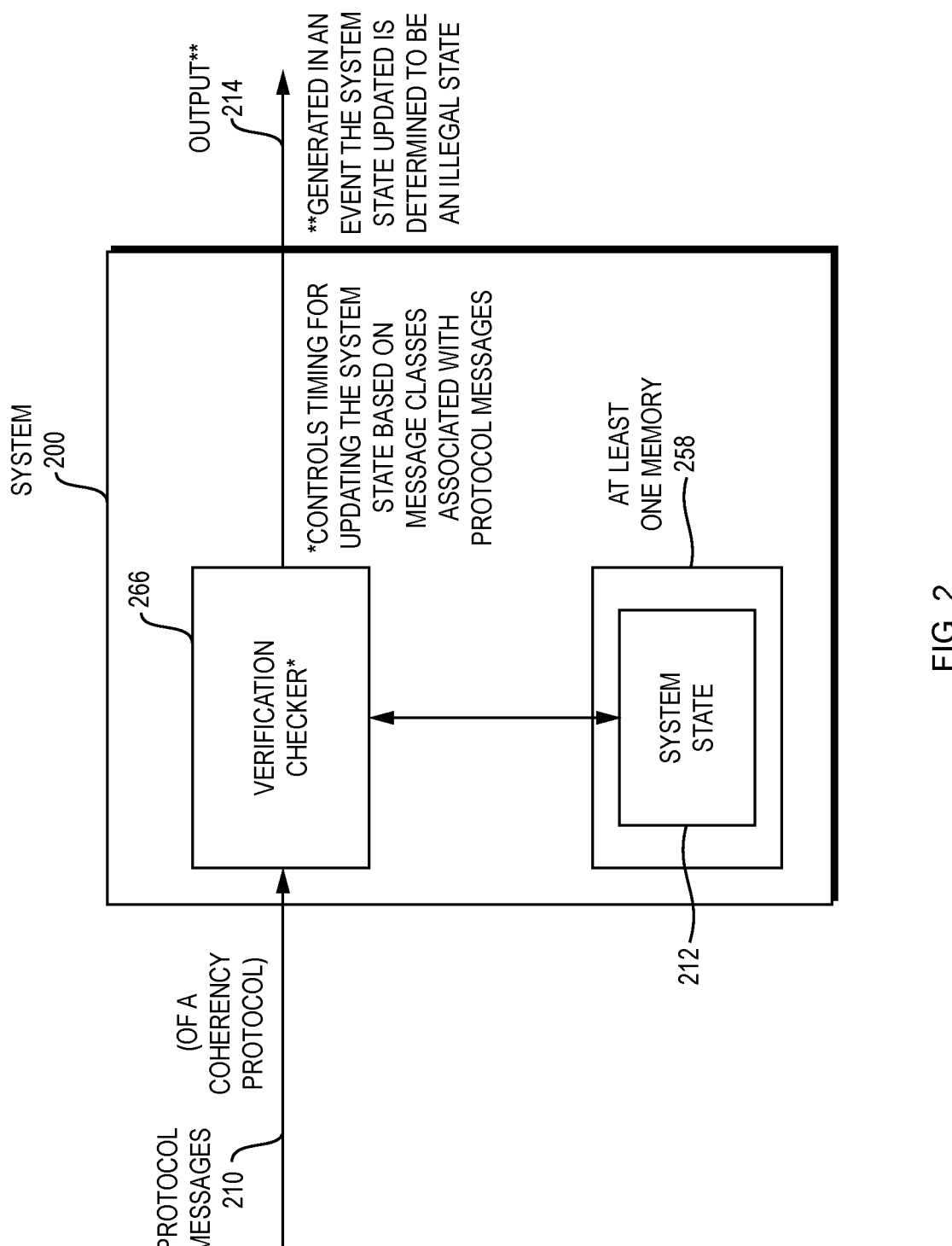
FIG. 2 is a block diagram of an example embodiment of a system that may be used for implementing coherency protocol verification.

FIG. 2 is a block diagram of an example embodiment of a system 200 that may be used for implementing coherency protocol verification. With reference to FIG. 1 and FIG. 2, the system 200 may be employed in the computer-based system 100 for non-limiting example. The system 200 comprises a verification checker 266 configured to monitor protocol messages 210 of a coherency (coherence) protocol implemented via register-transfer level (RTL) logic (not shown) of the chip 108 to maintain cache coherency on the chip 108. The verification checker 266 may also be referred to interchangeably herein as a verification engine. The protocol messages 210 are generated via the RTL logic. The system 200 further comprises at least one memory 258. The verification checker 266 is further configured to perform verification of the coherency protocol based on system state 212 stored in the at least one memory 258. The verification performed includes updating the system state 212 based on the protocol messages 210 monitored and controlling timing for the updating based on message classes (not shown). The message classes are associated with the protocol messages 210 monitored.

The chip 108 may include a plurality of processor cores (not shown). The plurality of processor cores may be included as part of a system-on-a-chip (SoC) or multi-chip/multi-core design implemented on the chip 108 for non-limiting examples. The system state 212 may include per-cache-line-per-processor-core ownership state (not shown) for each processor core of the plurality of processor cores.

The system 200 may further comprise a simulator (not shown) configured to perform simulation of the RTL logic and the protocol messages 210 may be generated via the simulation performed. The verification checker 266 may be implemented by a processor of the computer-based system 100 for non-limiting example, such as the central processing unit (CPU) 966 of FIG. 9, disclosed further below for non-limiting example.

Continuing with reference to FIG. 1 and FIG. 2, the message classes may include a fast-path message class (not shown). The timing for the updating may be immediate in an event the fast-path message class is associated with a protocol message of the protocol messages 110 monitored. The fast-path message class may indicate that the protocol message associated therewith results in access to memory on the chip 108 being granted.

The message classes may further include a slow-path message class (not shown) and the timing for the updating may be delayed and responsive to a trigger (not shown) in an event the slow-path message class is associated with a protocol message of the protocol messages 210 monitored. The trigger may be a response protocol message (not shown) of the coherency protocol. The slow-path message class may indicate that the protocol message associated therewith results in access to memory on the chip 108 being removed.

The verification checker 266 may be further configured to determine, responsive to the updating, whether the system state 212 updated is a legal state (not shown) or an illegal state (not shown). The verification checker 266 may be further configured to generate an output 214 in an event the system state 212 updated is determined to be the illegal state. The output 214 may be an error message (not shown) for non-limiting example.

The verification checker 266 may be further configured to output the error message to the simulation log file 104 for non-limiting example. The error message may include a representation (not shown) of a cache line address associated with the illegal state, a reason for the illegal state, or a combination thereof for non-limiting examples that may represent a condition identified as causing a data inconsistency issue on the chip 108.

The illegal state may be determined based on an ownership state (not shown) for a cache line (not shown) wherein the ownership state indicates that multiple exclusive (unique) owners (not shown) have ownership of the cache line for non-limiting example. According to an example embodiment, the legal state may be an ownership state associated with a cache line and may be consider a legal ownership state in an event such state is considered a) invalid, that is, not owned in any processor core of the chip 108, b) shared, namely associated with read-only ownership in one or more processor cores, or c) exclusive (unique), that is, associated with read/write ownership in exactly one processor core. All other ownership states may be considered illegal states.

The verification checker 266 may be further configured to update the system state 212 and control the timing for the updating on a protocol-message-by-protocol-message basis. The verification checker 266 may be further configured to identify, on the protocol-message-by-protocol-message basis, a respective message class associated with a protocol message of the protocol messages 210 monitored.

The verification checker 266 may be further configured to identify the message classes associated with the protocol messages 210 monitored by employing a protocol-message-to-message-class map (not shown). The protocol-message-to-message-class map may include mappings between opcodes (not shown) of the protocol messages 210 monitored and identifiers (not shown) of the message classes. The protocol-message-to-message-class map may be stored in the at least one memory 258. The verification checker 266 may employ the protocol-message-to-message-class map in a method for verifying a coherency protocol, such as the method of FIG. 3A, disclosed below.

Figure 3A:
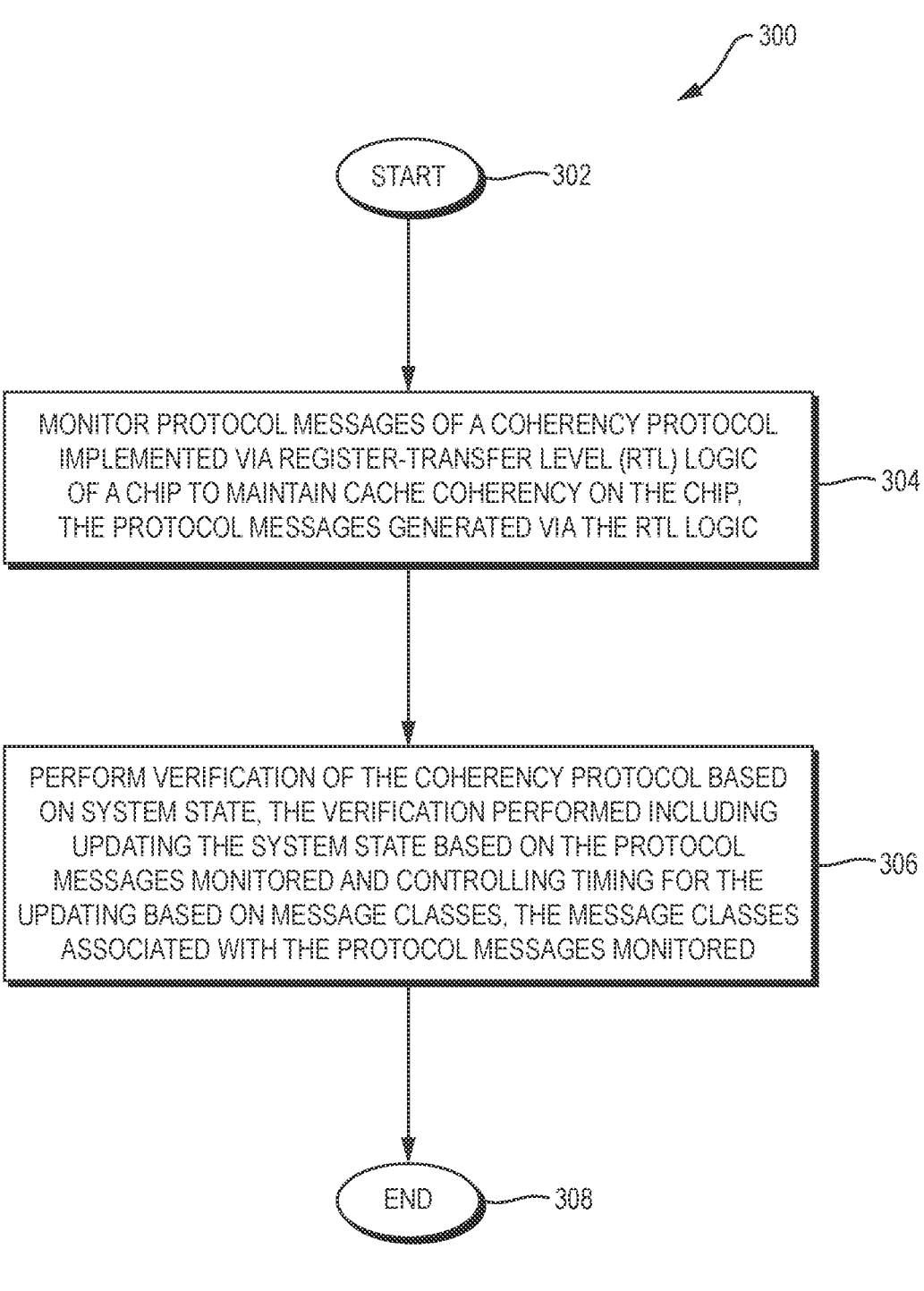
FIG. 3A is a flow diagram of an example embodiment of a method for coherency protocol verification.

FIG. 3A is a flow diagram of an example embodiment of a method (300) for coherency protocol verification. The method (300) may be a computer-implemented method. The method (300) begins (302) and comprises monitoring protocol messages of a coherency protocol implemented via register-transfer level (RTL) logic of a chip to maintain cache coherency on the chip (304). The protocol messages are generated via the RTL logic. The method (300) further comprises performing verification of the coherency protocol based on system state (306). The verification performed includes updating the system state based on the protocol messages monitored and controlling timing for the updating based on message classes. The message classes are associated with the protocol messages monitored. The method (300) thereafter ends (308) in the example embodiment.

The method (300) may further comprise performing simulation of the RTL logic and the protocol messages may be generated via the simulation performed. The method (300) may further comprise determining, responsive to the updating, whether the system state updated is a legal state or an illegal state and generating an output in an event the system state updated is determined to be the illegal state. The output may be an error message. The method (300) may further comprise outputting the error message to a simulation log file. The error message may include a representation of a cache line address associated with the illegal state, a reason for the illegal state, or a combination thereof.

The method (300) may further comprise updating the system state and controlling the timing for the updating on a protocol-message-by-protocol-message basis. The method (300) may further comprise identifying, on the protocol-message-by-protocol-message basis, a respective message class associated with a protocol message of the protocol messages monitored.

The method (300) may further comprise identifying the message classes associated with the protocol messages monitored. The identifying may include employing a protocol-message-to-message-class map. The protocol-message-to-message-class map may include mappings between opcodes of the protocol messages monitored and identifiers of the message classes.

Figure 3B:
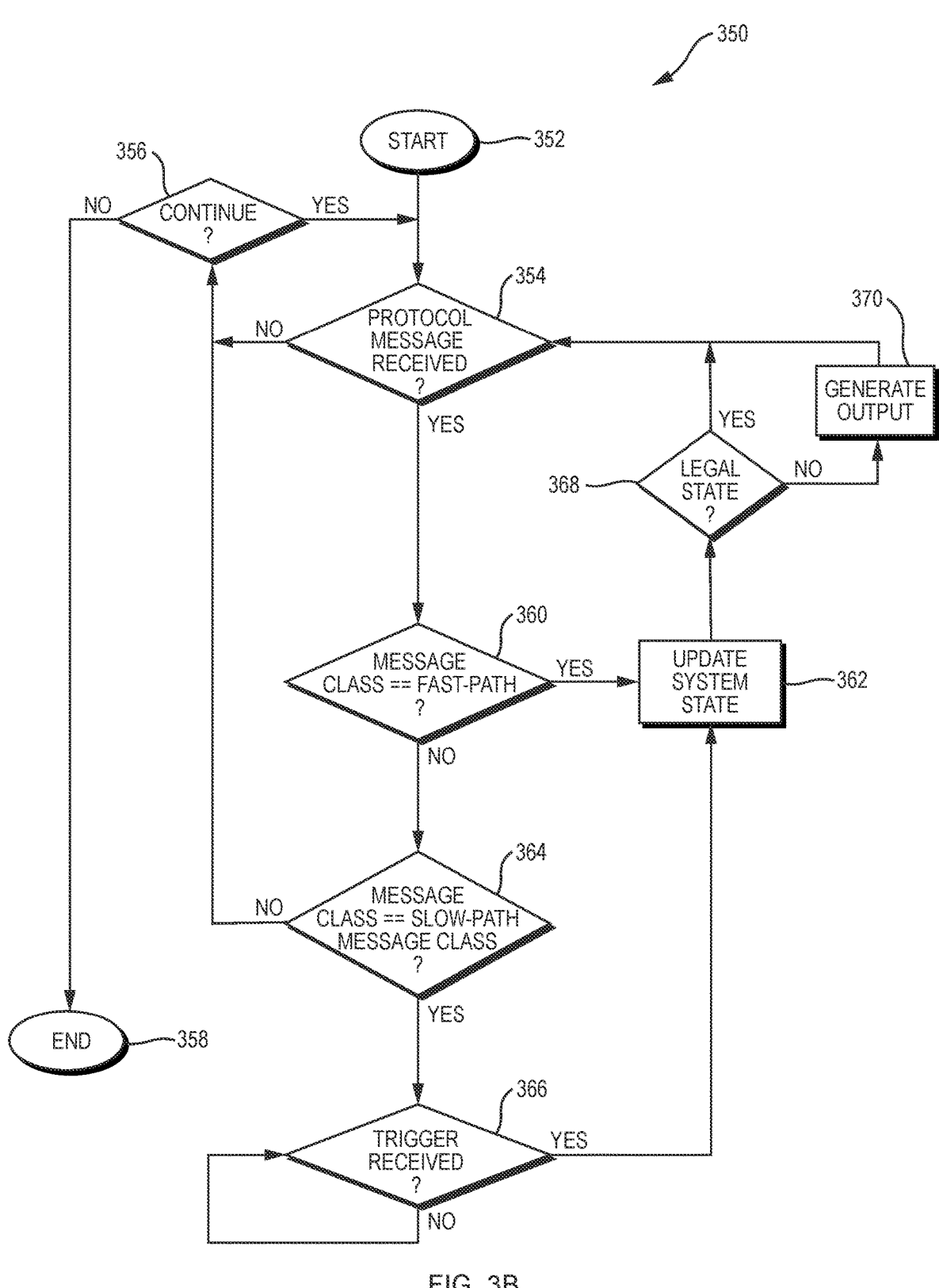
FIG. 3B is a flow diagram of an example embodiment of another method for coherency protocol verification.

FIG. 3B is a flow diagram of an example embodiment of another method (350) for coherency protocol verification. The method (350) begins (352) and checks (354) for whether a protocol message has been received. If not, the method (350) may check (352) for whether to continue. If no, the method (350) thereafter ends (358) in the example embodiment. If, however, the method (350) is to continue, the method (350) may continue to check (354) if a protocol message has been received. If yes, the method (350) may check (360) if the protocol message received is associated with a fast-path message class. If yes, the method may update the system state 362 based on the protocol message received.

The method (350) may proceed and check (368) if the system state updated is a legal state. If no, the system may generate an output (370) and again check (354) if a protocol message has been received. Similarly, if the check (368) indicates that the system state updated is legal, the method (350) may again check (354) if a protocol message has been received.

If the message class is not the fast-path message class, however, the method (354) may check if the message class is the slow-path message class. If no, the method (354) may check (356) for whether to continue, as disclosed above. If, however, the message class is the slow-path message class, the method (350) may proceed to wait (366) for a trigger to be received. If the trigger is received, the method may proceed to update the system state (362) in accordance with the protocol message received and proceed to check (368) if the system state updated is a legal state, as disclosed above.

Figure 4A:
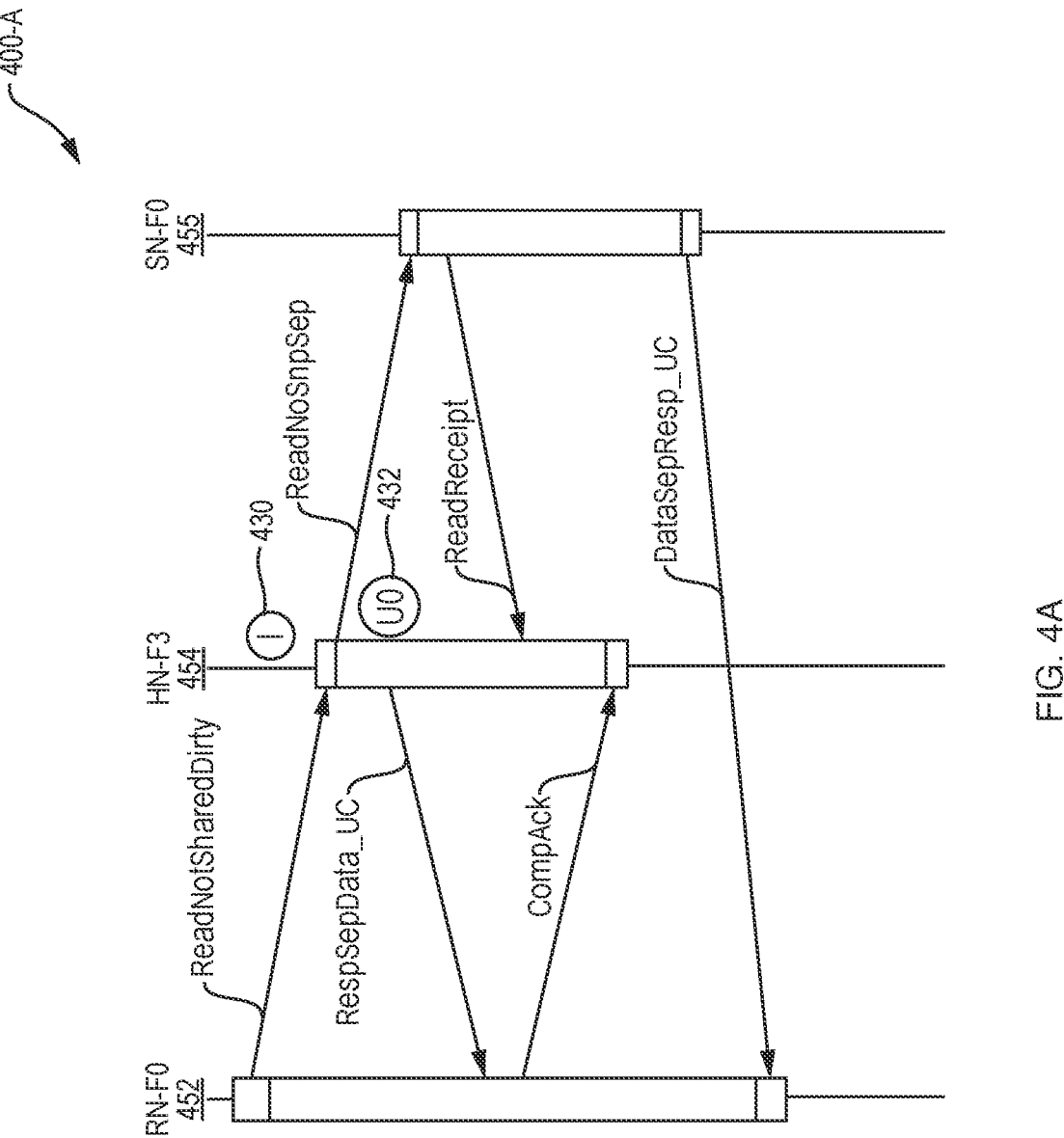
FIGS. 4A-C are bounce diagrams of exemplifications of protocol examples.
Figure 4B:
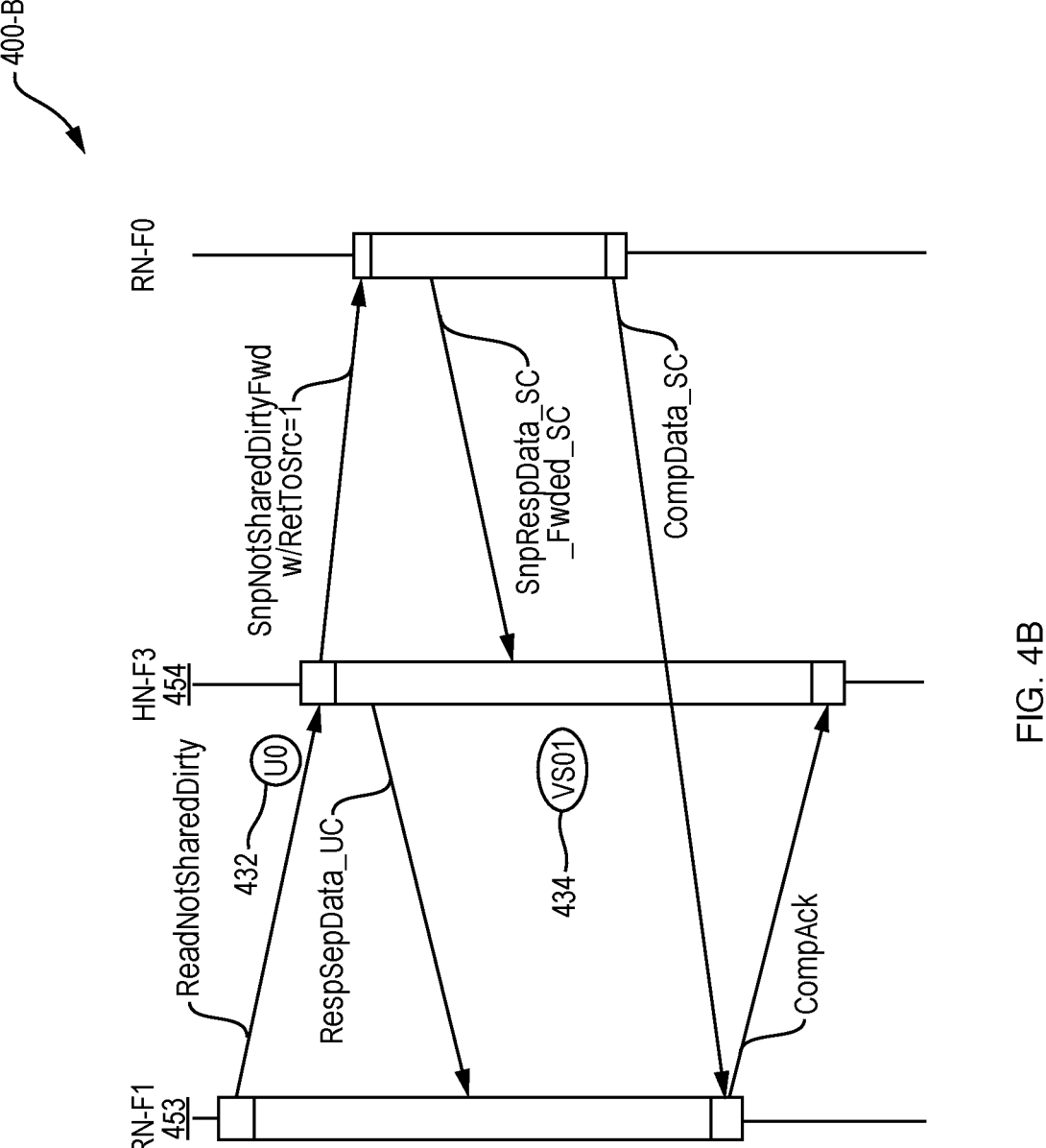
Figure 4C:
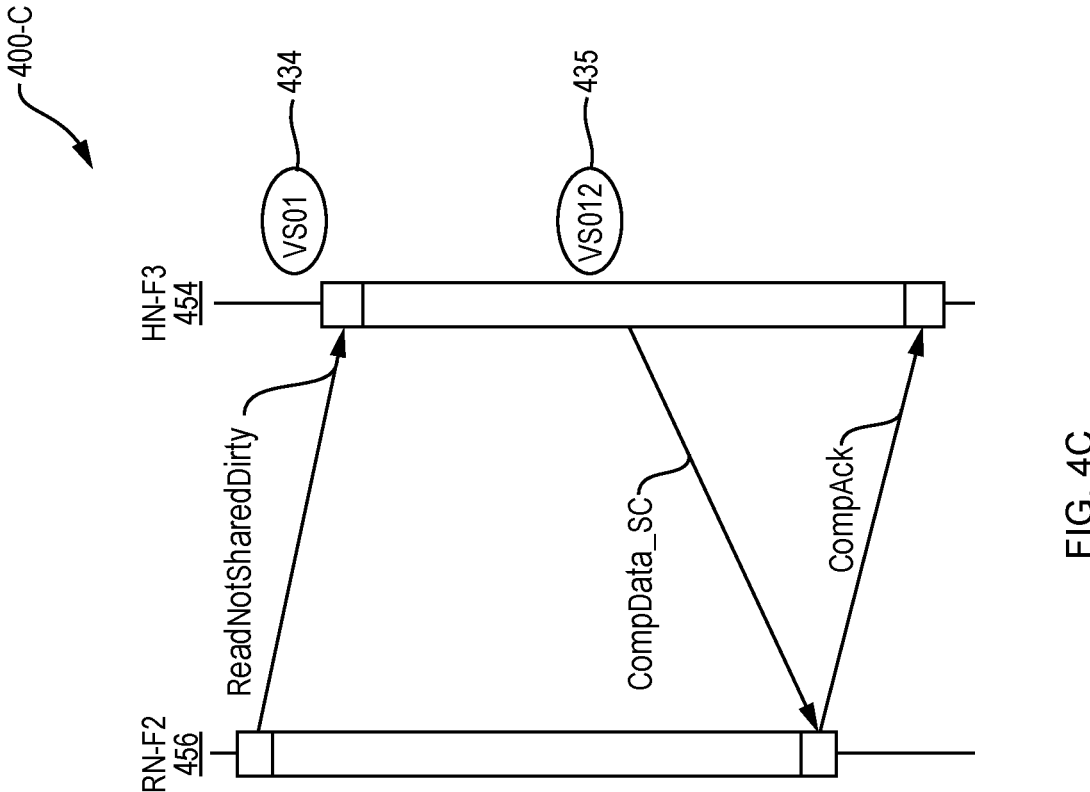

With reference to FIG. 1 and FIGS. 3A and 3B, the method (300, 350) may be employed for coherency protocol verification of a RTL logic design for implementation on the chip 108 to maintain cache coherency on the chip 108. FIGS. 4A-C are bounce diagrams of exemplifications of protocol examples of a coherency protocol for non-limiting examples. Such protocol examples are described with reference to protocol messages and nodes of the ARM AMBA CHI protocol for non-limiting examples.

FIG. 4A is a bounce diagram 400-A of an exemplification of the CHI protocol for non-limiting example. The CHI protocol classifies different components in a system by node type and provides a means for communication between nodes. The system may be a chip, such as the chip 108 of FIG. 1, and the nodes may be processor cores implemented on the chip 108. The three types of main node types are Request Nodes (RNs), Home Nodes (HNs), and subordinate Nodes (SNs). RNs generate transactions, like read and write requests, and these transactions are sent to HNs. HNs are responsible for ordering Requests, generating transactions to SNs, and can issue snoops or handle distributed virtual memory (DVM) operations.

RNs can be fully coherent, I/O coherent, or I/O coherent with DVM support. Fully coherent request nodes (RN-Fs) contain coherent caches and will accept and respond to snoops. I/O Coherent Request Nodes (RN-Is) do not have coherent caches and cannot accept snoops. I/O coherent request nodes with DVM support (RN-Ds) have the same functionality as RN-Is and can also accept DVM messages.

HNs can be fully coherent, non-coherent, or miscellaneous nodes (MNs). Fully coherent home nodes (HN-Fs) order all requests to coherent memory and issue snoops to RN-Fs. Non-coherent Home Nodes (HN-Is) order requests that target the I/O subsystem. MNs handle DVM transactions sent by request nodes.

SNs are nodes that connect to memory devices that back the coherent memory space. For example, a memory controller would connect to a SN which may also be referred to as a SN-F node. SN-Fs for peripheral or normal memory connect to I/O peripherals or non-coherent memory and may not be fully coherent.

Some components in the system can also be classified as a requester or completer. A requester is a component that starts a transaction by issuing a request message. The term requester can be used for a component that independently initiates transactions and can also be used for an interconnect component that issues a downstream request message independently, or as a side-effect of other transactions that are occurring in the system. A completer is a component that responds to a transaction it receives from another component. A completer can either be an interconnect component, such as a HN or an MN, or a component, such as a SN, that is outside of the interconnect.

Each component in the system is assigned a unique node identifier (ID). CHI uses a System Address Map (SAM) controller to convert physical addresses to a target node ID. The SAM controller may be referred to herein simply as a SAM. To be able to determine the target node ID of outgoing requests, each RN and HN has a SAM. All protocol messages are sent in the form of a "flit." Flits are a packetized collection of control fields and identifiers that communicate a protocol message. Each protocol message has a respective opcode which, according to an example embodiment, may be associated with a message class, such as a fast-path message class or slow-path message class, as disclosed above.

With reference to the bounce diagram 400-A of FIG. 4A, protocol messages are exchanged among a fully coherent request node, namely RN-F0 452, a fully coherent home node, namely HN-F3 454, and a subordinate node, namely SN-F0 455. The SN-F0 455 may not be fully coherent. Such nodes, namely the RN-F0 452, HN-F3 454, and SN-F0 455, are unique and their respective numeric designations 0, 3, and 0 are arbitrary.

In the bounce diagram 400-A, an application processor (AP) (not shown) of the RN-F0 452 issues an instruction to read data from a requested address and the SAM of the RN-F0 452 looks at the requested address and determines it needs to be sent to the HN-F3 454. As such, the RN-F0 452 transmits a ReadNotSharedDirty protocol message to the HN-F3 454. Such message is a read request to a snoopable address region to carry out a load from a cache line. The request arrives at the HN-F3 454 which, in turn, sends RespSepData_UC protocol message to the RN-F0 452 and updates the cache line ownership state 432 to U0, indicating that the cache line state is read/write ownership in exactly 1 core, namely the RN-F1 453. The RN-F0 452 sends the CompAck protocol message to the HN-F3 454 after receiving the RespSepData_UC. The HN-F3 454 looks up the last-level cache tag (LTG), checks if the address is in the cache of the HN-F3 454, sees that the address is invalid 430, and sees that data is in memory. The HN-F3 454 determines that the SN-F0 455 is the correct memory controller and sends the ReadNoSnpSep protocol message to the SN-F0 455 to tell the SN-F0 455 to send data to the RN-F0 452. The SN-F0 455, in turn, sends the ReadReceipt protocol message to the HN-F3 454 to indicate it has accepted the read request. The SN-F0 455 does as requested and, via the DataSepResp_UC protocol message, provides a clean copy of the cache line to the requester, namely the RN-F0 452. Such protocol message exchange shown in the bounce diagram 400-A is in accordance with the coherency protocol and there is no violation.

FIG. 4B is a bounce diagram 400-B of another exemplification of the CHI protocol for non-limiting example. In the bounce diagram 400-B, another application processor (AP) (not shown) of another processor core of another requester node, namely RN-F1 453, issues an instruction to read data from same requested address and the SAM of the RN-F1 453 looks at the requested address and determines it needs to be sent to the HN-F3 454. As such, the RN-F1 453 transmits a ReadNotSharedDirty protocol message to the HN-F3 454.

The request arrives at the HN-F3 454 which determines it is not in the cache of HN-F3 454 and checks the cache line ownership state in the LLC of HN-F3 454 by looking up the LTG for the cache line and sees that the cache line ownership state 432 is U0, indicating that the cache line state indicates read/write ownership in the RN-F0 452. As such, the HN-F3 454 sends the SnpNotSharedDirtyFwd protocol message to the RN-F0 452 to tell the RN-F0 452 to send data back to the HN-F3 454 (for the LLC of the HN-F3 454) and to the requester, namely the RN-F1 453. The RN-F0 452 does as requested and sends the data to the HN-F3 454 via the SnpRespData_SC_Fwded_SC protocol message and to the RN-F1 453 (via the CompData_SC protocol message).

The HN-F3 454, in turn, updates the LTG to VS01 434, indicating that the cache line is valid at the HN-F3 454 and has an ownership state that is shared, that is, shared by RN-F0 452 and RN-F1 453. The RN-F1 453 sends the CompAck protocol message to the HN-F3 454 after receiving the requested data via the CompData_SC protocol message, thereby acknowledging receipt of the data. Such protocol message exchange shown in the bounce diagram 400-B is in accordance with the coherency protocol and there is no violation.

FIG. 4C is a bounce diagram 400-C of another exemplification of the CHI protocol for non-limiting example. In the bounce diagram 400-C, yet another application processor (AP) (not shown) of yet another processor core of yet another requester node, namely RN-2, issues an instruction to read data from the same requested address and the SAM of the RN-F2 456 looks at the requested address and determines it needs to be sent to the HN-F3 454. As such, the RN-F2 456 transmits a ReadNotSharedDirty protocol message to the HN-F3 454. Such request arrives at the HN-F3 454 which, in turn, looks up the LTG and sees that the latest data is present in the LLC, as indicated by the valid indication in the present ownership state, namely VS01 434, as updated in the bounce diagram of FIG. 4B, disclosed above.

Continuing with reference to the bounce diagram 400-C of FIG. 4C, the HN-F3 454 sends data back to the RN-F2 456 via the CompData_SC protocol message and updates the LTG to indicate the ownership to be VS012 435, thereby indicating that a) the cache line is valid in the LLC of the HN-F3 454, b) the RN-F0 452, RN-F1 453, and RN-F2 456 all have a copy of the data of the requested cache line, and c) the ownership state is shared (read-only ownership in more than one core). The RN-F2 456 acknowledges receipt of data via the CompAck protocol message in accordance with the coherency protocol to ensure no later snoop can arrive before CompData_SC protocol message. A protocol requirement is fulfilled by the HN-F3 454 waiting for the CompAck before servicing a new request for the same cache line. Such protocol message exchange shown in the bounce diagram 400-B is in accordance with the coherency protocol and there is no violation.

Figure 5A:
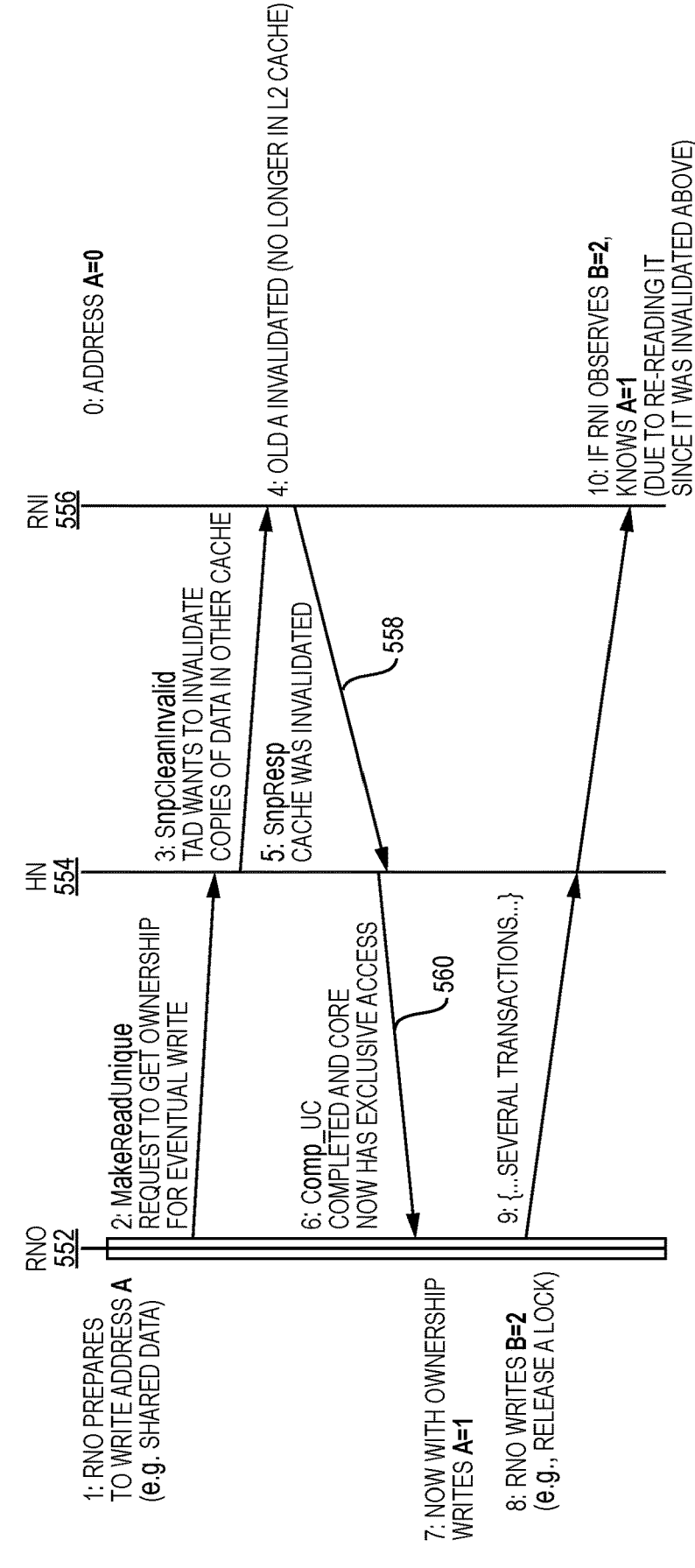
FIG. 5A is a bounce diagram of an exemplification of protocol messages in accordance with a coherency protocol.

FIG. 5A is a bounce diagram 500-A of an exemplification of protocol messages in accordance with a coherency protocol. The bounce diagram 500-A includes protocol messages that are exchanged among a first requester node, namely RN0 552, a home node (HN) 554, and a second requester node, namely RN1 556. The RN0 552 and RN1 556 may be referred to interchangeably herein as CPU0 and CPU1. At the HN 554, there is a last level cache (LLC) (not shown) that may be partitioned into multiple tag and data units (TADs) (not shown), that may be referred to as shared cache memories. Initially (0:), address A=0, that is, data at A has a value of 0, and that A is shared, that is, the data at address A is shared. The address A may be referred to as a cache line address or, simply, an address. Initially, the HN 554 knows, via an ownership state of address A, that A is shared by RN0 552 and RN1 556.

In the bounce diagram 500-A, the following sequence of operations are shown.

(1:) the RN0 552 prepares to write address A;

(2:) the RN0 552 sends a MakeReadUnique request protocol message to the HN 554 to get ownership of address A for an eventual write to address A;

(3:) the HN 554 sends a SnpCleanInvalid protocol message to the RN1 556 as the TAD of the LLC of the HN 554 wants to invalidate copies of data in the cache of the RN1 556;

(4:) the RN1 556, in turn, changes the cache line to an invalid state at the RN1 556 and the old A is invalidated, that is, such address is no longer in a L2 cache of RN1 556;

(5:) the RN1 556 responds to the HN 554 with the SnpResp protocol message to indicate to the HN 554 that the cache was invalidated;

(6:) the HN, 554 in turn, sends a Comp_UC protocol message to the RN0 552 to indicate that the MakeReadUnique request has completed and that the processor core, namely RN0 552, now has exclusive access to A;

(7:) now, since RN0 552 has ownership of the cache line, namely the address A, RN0 552 writes A=1;

(8:) RN0 552 writes another address B=2, wherein B is a different cache line address from A, and B is used by RN0 552 as a semaphore that, in response to being written with the value of 2, releases a lock on A that indicates that writing of A has completed and a correct value of A can be observed;

(9:) time moves on, that is, several transactions may transpire; and (10:) RN1 556 observes that B=2 and, thus, sees that A=1, as RN1 556 re-reads A since A was invalidated at RN1, as disclosed above with regard to (4:).

In the example embodiment of FIG. 5A, the HN 554 waits for the SnpResp protocol message 558, that is (5:), before sending the Comp_UC protocol message 560 at (6:). Such behavior, namely (0:)-(10:) as shown in the bounce diagram 500-A and disclosed above, represents intended behavior and there is no coherency protocol violation, whereas the bounce diagram 550-B of FIG. 5B, disclosed below, does include a coherency protocol violation.

Figure 5B:
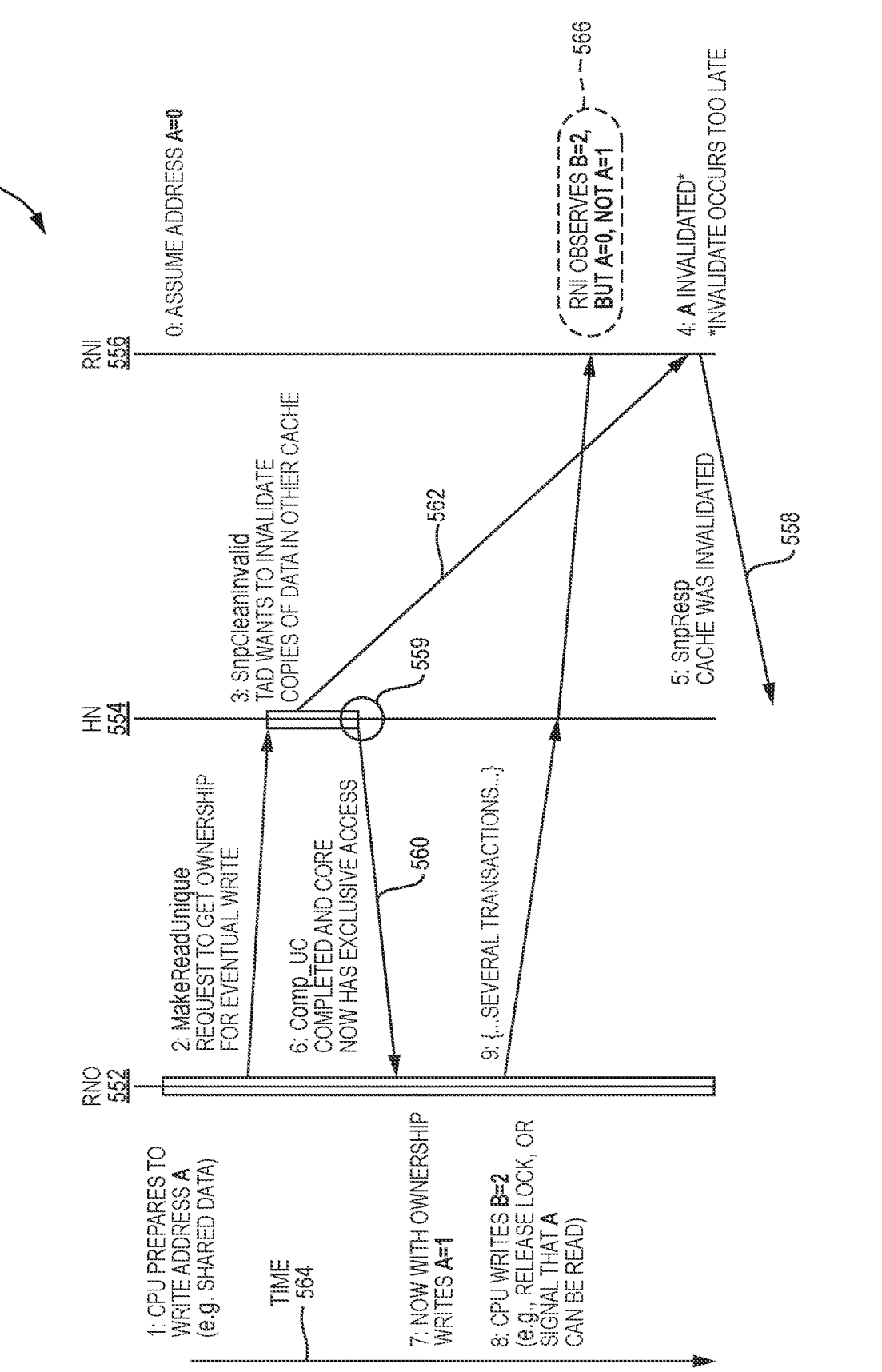
FIG. 5B is a bounce diagram of an exemplification of protocol messages in which there is a violation of a coherency protocol.

FIG. 5B is a bounce diagram 500-B of an exemplification of protocol messages in which there is a violation 599 of a coherency protocol. With reference to FIGS. 5A and 5B, the bounce diagram 500-B differs from the bounce diagram 500-A in that the coherency protocol implementation at the HN 554 does not wait for the SnpResp protocol message 558 before sending the Comp_UC protocol message 560, resulting in the protocol violation 559 due to a race condition. Since the SnpCleanInvalid protocol message 562 issued at (3:) arrives at the RN1 556 of the bounce diagram 500-B later in time 564 relative to as shown in 500-A, a result 566 following (9:) in the bounce diagram 500-B is that RN1 556 observes B=2, allowing RN1 566 to read A and, since the invalidate, namely (4:) of A has not yet occurred, RN1 556 reads the value from its cache and, thus, reads the value as being A=0 instead of A=1.

Such a protocol violation 559 may also be referred to as a bug and may be complex and difficult to discover in a verification phase as the bug results due to a race condition, that is, a race between the sending of the SnpCleanInvalid protocol message 562 and the Comp_UC protocol message 560. The protocol violation 559 can, thus, result in data inconsistency of A at the RN1 556, depending on the timing between when the RN1 556 sees that B=2 and when the SnpCleanInvalid protocol message 562 arrives at the RN1 556. A verification method for exposing such a bug is complex and can consume extensive time and resources to identify.

An example embodiment disclosed herein associates protocol messages with message classes, such as the fast-path message class and slow-path message class disclosed above, enabling a verification checker, such as the verification checker 266 of FIG. 2, disclosed above, to identify such a bug, namely the protocol violation 559 of FIG. 5B, efficiently, based on updating system state in accordance with the protocol messages and at a time that is driven by the respective classes associated with the protocol messages. It should be understood, however, that the protocol violation 559 is for non-limiting example.

Figure 6:
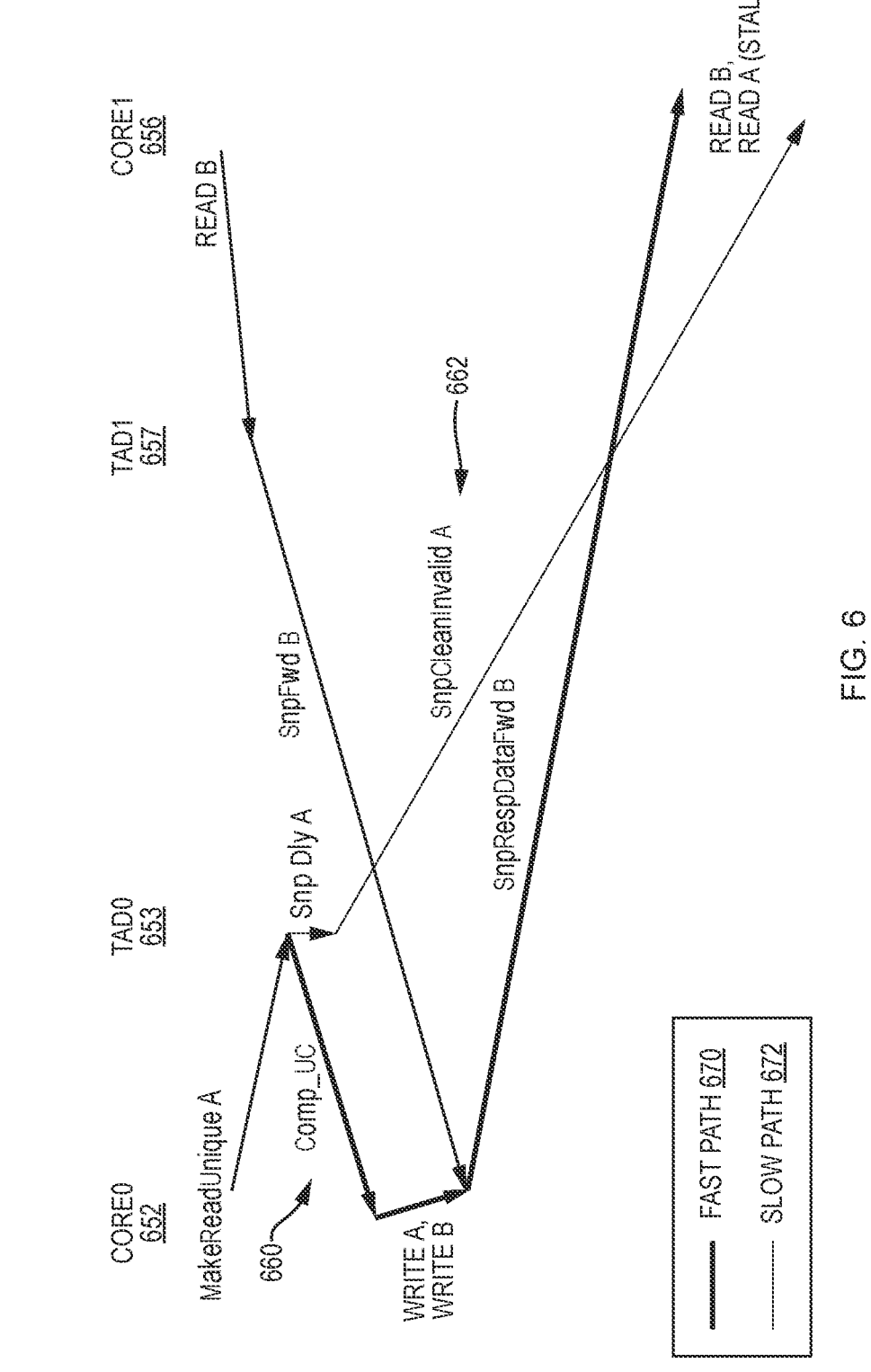
FIG. 6 is a bounce diagram of an example embodiment of a fast path and a slow path.

FIG. 6 is a bounce diagram 600 of an example embodiment of a fast path 670 and a slow path 672. In the example embodiment of FIG. 6, the Comp_UC 660 protocol message, and SnpCleanInvalid 662 protocol message for address A, travel along the fast path 670 and slow path 672, respectively. The CORE 652 sends the MakeReadUnique protocol message to request ownership for an eventual write to address A, that is, a cache line address A. The Comp_UC 660 protocol message gives permission to the CORE0 652 to write address A and the SnpCleanInvalid 662 protocol message removes a stale copy of address A from the CORE1 656. A home node (not shown) includes a TAD0 653 for maintaining ownership state per cache line for the CORE0 652 and a TAD1 657 for maintaining ownership state per cache line for the CORE1 656. To maximize a chance to find a bug, that is, a protocol violation, the slow path 672 wants to be very slow, and the fast path 670 wants to be very fast, which can be difficult to manage in a simulation.

In the example embodiment of FIG. 5, the Comp_UC 660 protocol message is associated with the fast-path message class while the SnpCleanInvalid 662 protocol message is associated with the slow-path message class. While such protocol messages may define at least one update to cache line ownership (system state), timing of such updates is controlled by their respective associated classes. As such, the system state is updated immediately based on the Comp_UC 660 protocol message whereas the system state update is delayed for the SnpCleanInvalid 662 protocol message.

Such control over the timing of such updates can expose the protocol violation, disclosed above with regard to FIG. 5C. Specifically, continuing with reference to FIG. 6, an initial cache line ownership state for A may be S01 (not shown), which is legal); however, because the Comp_UC 660 causes a system update change that is updated, immediately, the ownership state for A is updated to U0S1, which is an illegal state, and enables the protocol violation to be caught and, thus, addressed in the RTL logic. The association of fast-path and slow-path message classes to the protocol messages may be viewed in the context of static hold timing analysis, disclosed below.

Figure 7:
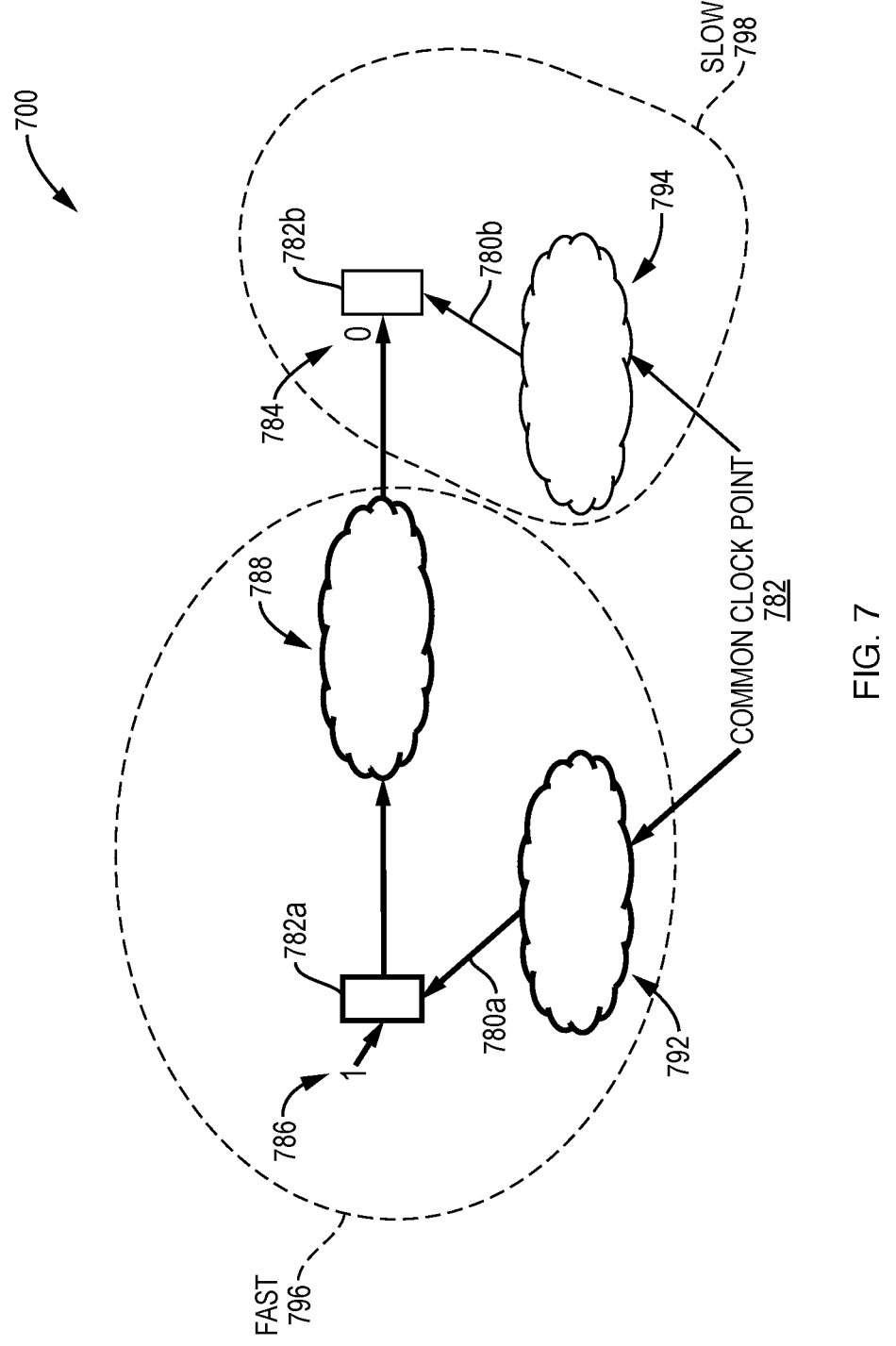
FIG. 7 is a block diagram of an exemplification of static hold timing analysis.

FIG. 7 is a block diagram 700 of an exemplification of static hold timing analysis. The block diagram 700 includes a first flip-flop (FF) 782a and a second FF 782b, clocked by a first clock 780a and second clock 780b, respectively. The first clock 780a and second clock 780b are sourced from a common clock point 782 and arrive at the first FF 782a and second FF 782b after passing through respective logic (792, 794). An input 784 with a value of 0 is input to the second FF 782b and is held, in accordance with a hold time of the second FF 782b, for a defined amount of time after the second FF 782 is clocked by a rising edge (not shown) of the second clock 780b. When the first clock 780a transitions, the input 786 value of 1 that is input to the first FF 782 will race to the input 784 of the second FF 782, passing through logic 788 along the way.

Due to process variations and delay in the logic 788, it may be that, as the input 786 with a value of 1 propagates forward through the logic 788, it is so fast that the second FF 782b did not have time to sample the input 784 with the value of 0. As such, a cycle may be skipped due to the race and a hold violation may occur. To model such behavior while taking into account on-die process variation, a fast 796 process variation and a slow 798 process variation may be employed to expose such a violation. Different from employing fast and slow process variations, an example embodiment disclosed herein may associate protocol messages with fast-path and slow-path message classes and employ such class associations to determine when to update system state of cache lines, as disclosed above. Such an example embodiment may be employed to identify protocol violations otherwise difficult to simulate, for example, on a chip with multiple processor cores, such as the chip disclosed below with regard to FIG. 8.

Figure 8:
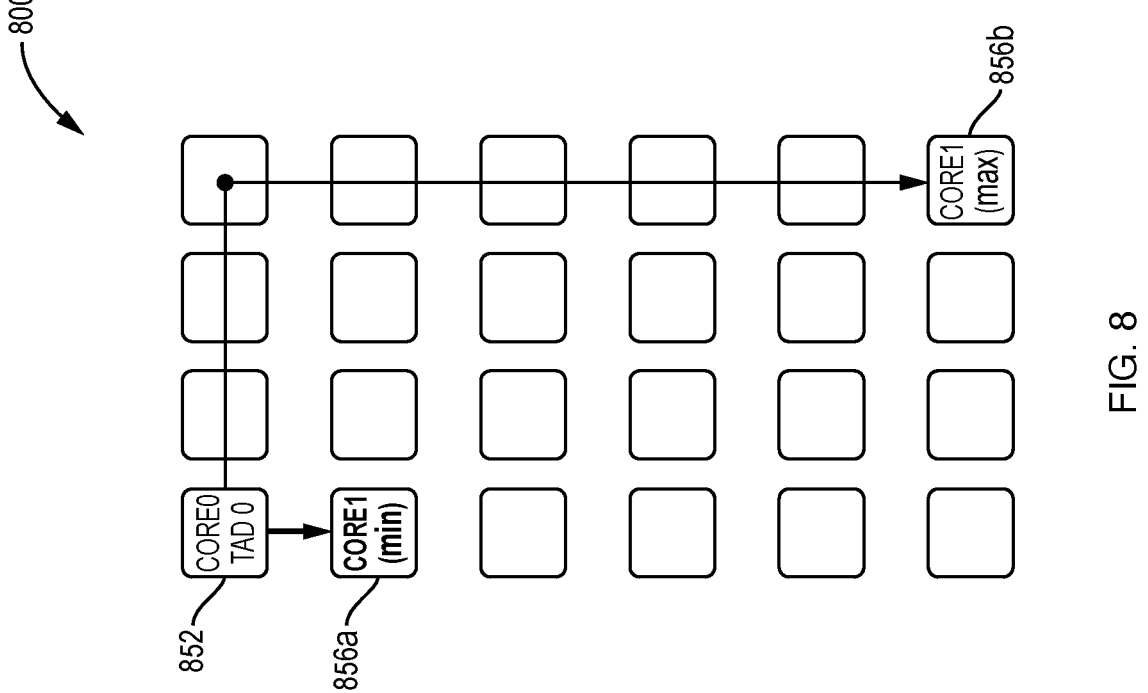
FIG. 8 is a block diagram of an example embodiment of a chip topology in which various embodiments of the present disclosure may be implemented.

FIG. 8 is a block diagram of an example embodiment of a chip topology 800 in which various embodiments of the present disclosure may be implemented. In the chip topology 800 it is not clear what the "best" assignments would be for assigning processor cores to "fast" and "slow" paths for exposing a coherency protocol violation in simulation. For example, the location 856a adjacent to the CORE0/TAD0 at location 852 may best for the "fast" path while the location 856b may be best for the "slow" path. An example embodiment disclosed herein does not depend on such decision making and exposes a coherency protocol manner in a different manner that utilizes message classes to control system state updates driven by protocol messages, as disclosed above.

Continuing with reference to FIG. 8, agents, such as processor cores in the topology 800 of a chip, acquiring new or upgraded access to a cache-line results in a system state update, such as a cache line ownership state, that occurs immediately in a simulation/verification environment, that is, as soon as a simulated protocol message causing such change in state leaves a home node. For protocol messages associated with a fast-path message class, a state update/check may be performed immediately, instead of waiting for any traversal of an interconnect within the topology 800 being simulated.

Non-limiting examples of CHI protocol messages that may be assigned to a fast-path message class are the CompData/DataSepResp protocol messages sent to a requester (TXDAT); the Comp/RespSepData protocol messages sent to requester (TXRSP); and a Direct Memory Transfer protocol message, such as a ReadNoSnp (TXREQ) protocol message sent to a memory controller.

A Direct Cache Transfer protocol message may be treated as a special case. An example embodiment may update state on Snp*Fwd (TXSNP) protocol message, but the snoop target's response is not known, although a known set of options may be known. Instead, state may not actually be updated; however, all possible final states may be checked for legality.

As a result of employing delayed update system state control over protocol messages associated with the slow-path message class, agents losing access to a cache-line may only happen upon a home node receiving a response from the agent. As such, a slow-path message class may be employed for a protocol message such that a state update/check is delayed until the message has fully traversal through the interconnect. The slow-path message class may be employed for a Snoop response (RXRSP/RXDAT) protocol message, such as disclosed above with regard to FIGS. 4A-C, or for a CopyBack data (RXDAT) protocol message.

Figure 9:
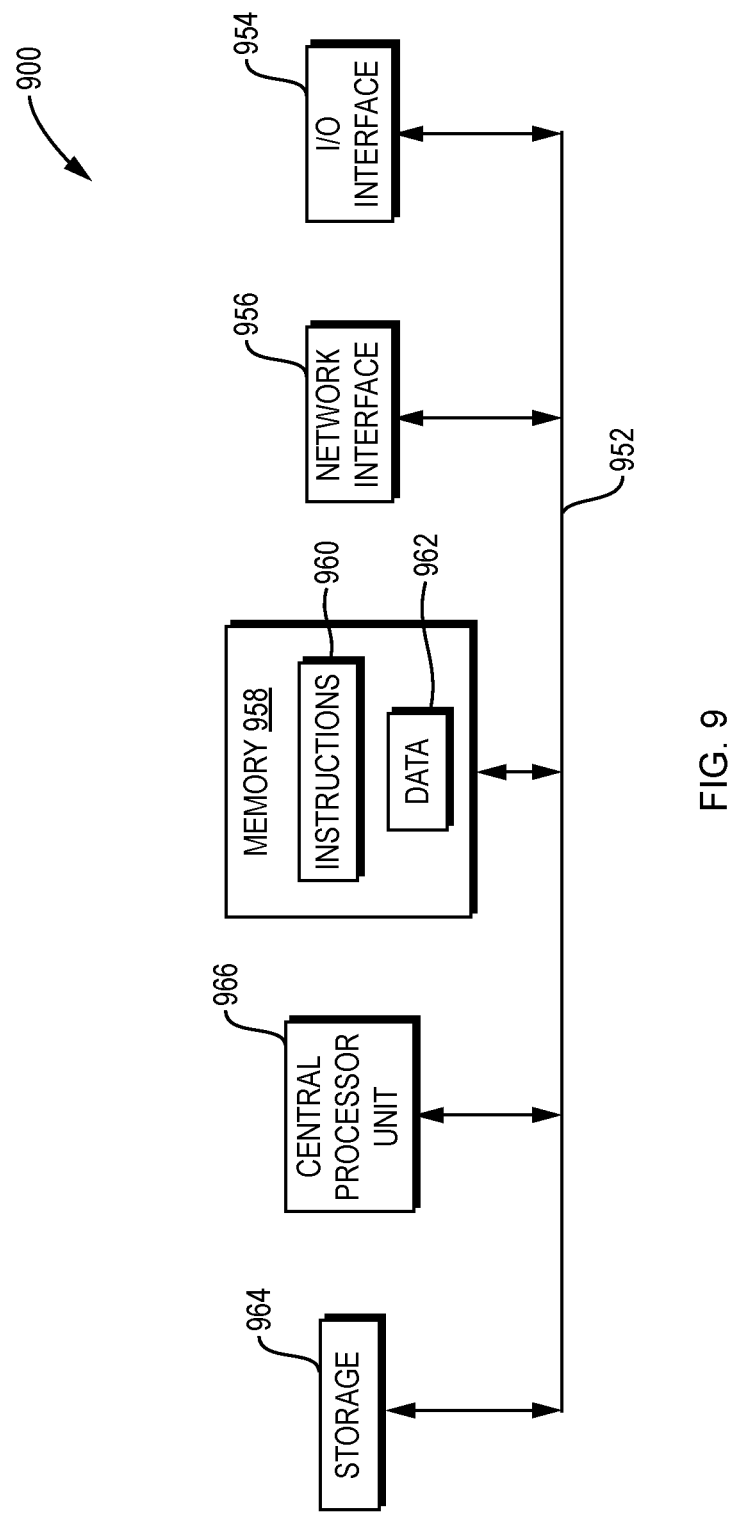
FIG. 9 is a block diagram of an example internal structure of a computer optionally within an embodiment disclosed herein.

FIG. 9 is a block diagram of an example of the internal structure of a computer 900 in which various embodiments of the present disclosure may be implemented. The computer 900 contains a system bus 952, where a bus is a set of hardware lines used for data transfer among the components of a computer or digital processing system. The system bus 952 is essentially a shared conduit that connects different elements of a computer system (e.g., processor, disk storage, memory, input/output ports, network ports, etc.) that enables the transfer of information between the elements. Coupled to the system bus 952 is an I/O device interface 954 for connecting various input and output devices (e.g., keyboard, mouse, displays, printers, speakers, etc.) to the computer 900. A network interface 956 allows the computer 900 to connect to various other devices attached to a network (e.g., global computer network, wide area network, local area network, etc.). Memory 958 provides volatile or non-volatile storage for computer software instructions 960 and data 962 that may be used to implement embodiments (e.g., methods 300, 350) of the present disclosure, where the volatile and non-volatile memories are examples of non-transitory media. Disk storage 964 provides non-volatile storage for computer software instructions 960 and data 962 that may be used to implement embodiments (e.g., methods 300, 350) of the present disclosure. A central processor unit 966 is also coupled to the system bus 952 and provides for the execution of computer instructions.

As used herein, the term "engine" may refer to any hardware, software, firmware, electronic control component, processing logic, and/or processor device, individually or in any combination, including without limitation: an application specific integrated circuit (ASIC), a field-programmable gate-array (FPGA), an electronic circuit, a processor and memory that executes one or more software or firmware programs, and/or other suitable components that provide the described functionality.

Example embodiments disclosed herein may be configured using a computer program product; for example, controls may be programmed in software for implementing example embodiments. Further example embodiments may include a non-transitory computer-readable medium that contains instructions that may be executed by a processor, and, when loaded and executed, cause the processor to complete methods described herein. It should be understood that elements of the block and flow diagrams may be implemented in software or hardware, such as via one or more arrangements of circuitry of FIG. 9, disclosed above, or equivalents thereof, firmware, a combination thereof, or other similar implementation determined in the future.

In addition, the elements of the block and flow diagrams described herein may be combined or divided in any manner in software, hardware, or firmware. If implemented in software, the software may be written in any language that can support the example embodiments disclosed herein. The software may be stored in any form of computer readable medium, such as random-access memory (RAM), read-only memory (ROM), compact disk read-only memory (CD-ROM), and so forth. In operation, a general purpose or application-specific processor or processing core loads and executes software in a manner well understood in the art. It should be understood further that the block and flow diagrams may include more or fewer elements, be arranged or oriented differently, or be represented differently. It should be understood that implementation may dictate the block, flow, and/or network diagrams and the number of block and flow diagrams illustrating the execution of embodiments disclosed herein.

While example embodiments have been particularly shown and described, it will be understood by those skilled in the art that various changes in form and details may be made therein without departing from the scope of the embodiments encompassed by the appended claims.

What is claimed is:

1. A system comprising:
   a verification checker configured to monitor protocol messages of a coherency protocol implemented via register-transfer level (RTL) logic of a chip to maintain cache coherency on the chip, the protocol messages generated via the RTL logic; and
   at least one memory, the verification checker further configured to perform verification of the coherency protocol based on system state stored in the at least one memory, the verification performed including updating the system state based on the protocol messages monitored and controlling timing for the updating based on message classes, the message classes including a fast-path message class and a slow-path message class, the message classes associated with the protocol messages monitored.

2. The system of claim 1, wherein the system further comprises a simulator configured to perform simulation of the RTL logic and wherein the protocol messages are generated via the simulation performed.

3. The system of claim 1, wherein the timing for the updating is immediate in an event the fast-path message class is associated with a protocol message of the protocol messages monitored.

4. The system of claim 1, wherein the fast-path message class indicates that the protocol message associated therewith results in access to memory being granted.

5. The system of claim 1, wherein the timing for the updating is delayed and responsive to a trigger in an event the slow-path message class is associated with a protocol message of the protocol messages monitored.

6. The system of claim 5, wherein the trigger is a response protocol message of the coherency protocol and wherein the slow-path message class indicates that the protocol message associated therewith results in access to memory being removed.

7. The system of claim 1, wherein the verification checker is further configured to:
   determine, responsive to the updating, whether the system state updated is a legal state or an illegal state; and
   generate an output in an event the system state updated is determined to be the illegal state.

8. The system of claim 7, wherein the output is an error message, wherein the verification checker is further configured to output the error message to a simulation log file, and wherein the error message includes a representation of a cache line address associated with the illegal state, a reason for the illegal state, or a combination thereof.

9. The system of claim 7, wherein the illegal state is determined based on an ownership state for a cache line indicating multiple exclusive owners.

10. The system of claim 1, wherein the verification checker is further configured to:
   update the system state and control the timing for the updating on a protocol-message-by-protocol-message basis; and
   identify, on the protocol-message-by-protocol-message basis, a respective message class associated with a protocol message of the protocol messages monitored.

11. The system of claim 1, wherein the verification checker is further configured to identify the message classes associated with the protocol messages monitored by employing a protocol-message-to-message-class map and wherein the protocol-message-to-message-class map includes mappings between opcodes of the protocol messages monitored and identifiers of the message classes.

12. The system of claim 1, wherein the chip includes a plurality of processor cores and wherein the system state includes per-cache-line-per-processor-core ownership state for each processor core of the plurality of processor cores.

13. A method comprising:
   monitoring protocol messages of a coherency protocol implemented via register-transfer level (RTL) logic of a chip to maintain cache coherency on the chip, the protocol messages generated via the RTL logic; and
   performing verification of the coherency protocol based on system state, the verification performed including updating the system state based on the protocol messages monitored and controlling timing for the updating based on message classes, the message classes including a fast-path message class and a slow-path message class, the message classes associated with the protocol messages monitored.

14. The method of claim 13, wherein the method further comprises performing simulation of the RTL logic and wherein the protocol messages are generated via the simulation performed.

15. The method of claim 13, wherein the timing for the updating is immediate in an event the fast-path message class is associated with a protocol message of the protocol messages monitored.

16. The method of claim 13, wherein the fast-path message class indicates that the protocol message associated therewith results in access to memory being granted.

17. The method of claim 13, wherein the timing for the updating is delayed and responsive to a trigger in an event the slow-path message class is associated with a protocol message of the protocol messages monitored.

18. The method of claim 17, wherein the trigger is a response protocol message of the coherency protocol and wherein the slow-path message class indicates that the protocol message associated therewith results in access to memory being removed.

19. The method of claim 13, further comprising:

determining, responsive to the updating, whether the system state updated is a legal state or an illegal state; and generating an output in an event the system state updated is determined to be the illegal state.

20. The method of claim 19, wherein the output is an error message, wherein the method further comprises outputting the error message to a simulation log file, and wherein the error message includes a representation of a cache line address associated with the illegal state, a reason for the illegal state, or a combination thereof.

21. The method of claim 19, wherein the illegal state is determined based on an ownership state for a cache line indicating multiple exclusive owners.

22. The method of claim 13, further comprising:

updating the system state and controlling the timing for the updating on a protocol-message-by-protocol-message basis; and identifying, on the protocol-message-by-protocol-message basis, a respective message class associated with a protocol message of the protocol messages monitored.

23. The method of claim 13, further comprising identifying the message classes associated with the protocol messages monitored, the identifying including employing a protocol-message-to-message-class map, the protocol-message-to-message-class map including mappings between opcodes of the protocol messages monitored and identifiers of the message classes.

24. The method of claim 13, wherein the chip includes a plurality of processor cores and wherein the system state includes per-cache-line-per-processor-core ownership state for each processor core of the plurality of processor cores.

25. A non-transitory computer-readable medium having encoded thereon a sequence of instructions which, when loaded and executed by at least one processor, causes the at least one processor to:

monitor protocol messages of a coherency protocol implemented via register-transfer level (RTL) logic of a chip to maintain cache coherency on the chip, the protocol messages generated via the RTL logic; and perform verification of the coherency protocol based on system state, the verification performed including updating the system state based on the protocol messages monitored and controlling timing for the updating based on message classes, the message classes including a fast-path message class and a slow-path message class, the message classes associated with the protocol messages monitored.

26. An apparatus comprising:

means for monitoring protocol messages of a coherency protocol implemented via register-transfer level (RTL) logic of a chip to maintain cache coherency on the chip, the protocol messages generated via the RTL logic; and means for performing verification of the coherency protocol based on system state, the verification performed including updating the system state based on the protocol messages monitored and controlling timing for the updating based on message classes, the message classes including a fast-path message class and a slow-path message class, the message classes associated with the protocol messages monitored.

* * * * *